(12) United States Patent
You et al.

(10) Patent No.: US 10,908,200 B2
(45) Date of Patent: Feb. 2, 2021

(54) RESONANT PHASE SENSING OF RESISTIVE-INDUCTIVE-CAPACITIVE SENSORS

(71) Applicant: Cirrus Logic International Semiconductor Ltd., Edinburgh (GB)

(72) Inventors: Zhong You, Austin, TX (US); Siddharth Maru, Austin, TX (US); Tejasvi Das, Austin, TX (US); Luke Lapointe, Austin, TX (US); Eric J. King, Austin, TX (US); Anthony S. Doy, Los Gatos, CA (US); Srdjan Marjianovic, Austin, TX (US); Drew Kinney, Austin, TX (US); Matthew Beardsworth, Austin, TX (US); Emmanuel Marchais, Dripping Springs, TX (US)

(73) Assignee: Cirrus Logic, Inc., Austin, TX (US)

( * ) Notice: Subject to any disclaimer, the term of this patent is extended or adjusted under 35 U.S.C. 154(b) by 5 days.

(21) Appl. No.: 16/267,079

(22) Filed: Feb. 4, 2019

(65) Prior Publication Data
US 2019/0302161 A1    Oct. 3, 2019

Related U.S. Application Data

(60) Provisional application No. 62/649,857, filed on Mar. 29, 2018, provisional application No. 62/721,134, (Continued)

(51) Int. Cl.
*G01R 27/26* (2006.01)
*G01R 27/02* (2006.01)
(Continued)

(52) U.S. Cl.
CPC ......... *G01R 27/2605* (2013.01); *G01D 5/202* (2013.01); *G01D 5/2006* (2013.01); (Continued)

(58) Field of Classification Search
CPC .. G01R 27/2605; G01R 27/02; G01R 27/267; G01R 27/28; G01R 31/2601; G01R 31/64; G01R 17/16; G01R 21/07
(Continued)

(56) References Cited

U.S. PATENT DOCUMENTS

| 4,888,554 A | 12/1989 | Hyde et al. |
| 5,286,941 A | 2/1994 | Bel |

(Continued)

FOREIGN PATENT DOCUMENTS

| DE | 4004450 A1 | 8/1991 |
| DE | 102015215330 A1 | 2/2017 |

(Continued)

OTHER PUBLICATIONS

International Search Report and Written Opinion of the International Searching Authority, International Application No. PCT/US2019/022518, dated May 24, 2019.
(Continued)

*Primary Examiner* — Raul J Rios Russo
(74) *Attorney, Agent, or Firm* — Jackson Walker L.L.P.

(57) ABSTRACT

A system may include a resistive-inductive-capacitive sensor, a driver configured to drive the resistive-inductive-capacitive sensor at a driving frequency, and a measurement circuit communicatively coupled to the resistive-inductive-capacitive sensor and configured to measure phase information associated with the resistive-inductive-capacitive sensor and based on the phase information, determine a displacement of a mechanical member relative to the resistive-inductive-capacitive sensor, wherein the displacement of the
(Continued)

mechanical member causes a change in an impedance of the resistive-inductive-capacitive sensor.

38 Claims, 6 Drawing Sheets

Related U.S. Application Data filed on Aug. 22, 2018, provisional application No. 62/739,970, filed on Oct. 2, 2018.

(51) Int. Cl.
| | |
|---|---|
| *G01D 5/20* | (2006.01) |
| *G01D 5/243* | (2006.01) |
| *G01R 27/28* | (2006.01) |
| *G01R 31/26* | (2020.01) |
| *G01R 31/64* | (2020.01) |
| *G01R 17/16* | (2006.01) |
| *G01R 21/07* | (2006.01) |

(52) U.S. Cl.
CPC .......... *G01D 5/2026* (2013.01); *G01D 5/243* (2013.01); *G01R 27/02* (2013.01); *G01R 27/025* (2013.01); *G01R 27/267* (2013.01); *G01R 27/2611* (2013.01); *G01R 27/28* (2013.01); *G01R 31/2601* (2013.01); *G01R 17/16* (2013.01); *G01R 21/07* (2013.01); *G01R 31/64* (2020.01)

(58) Field of Classification Search
USPC .......... 324/76.11–76.83, 459, 600, 649, 650, 324/658, 683
See application file for complete search history.

(56) References Cited

U.S. PATENT DOCUMENTS

| | | | |
|---|---|---|---|
| 5,898,136 | A | 4/1999 | Katsurahira |
| 6,231,520 | B1 | 5/2001 | Maezawa |
| 6,380,923 | B1 | 4/2002 | Fukumoto et al. |
| 8,384,378 | B2 | 2/2013 | Feldkamp et al. |
| 8,421,446 | B2 | 4/2013 | Straubinger et al. |
| 9,707,502 | B1 | 7/2017 | Bonifas et al. |
| 2003/0038624 | A1 | 2/2003 | Hilliard et al. |
| 2005/0192727 | A1 | 9/2005 | Shostak et al. |
| 2005/0258826 | A1 | 11/2005 | Kano et al. |
| 2006/0025897 | A1 | 2/2006 | Shostak et al. |
| 2007/0198926 | A1 | 8/2007 | Joguet et al. |
| 2008/0150905 | A1 | 6/2008 | Grivna et al. |
| 2009/0058430 | A1* | 3/2009 | Zhu .......................... G01D 5/24 324/691 |
| 2009/0140728 | A1 | 6/2009 | Rollins et al. |
| 2009/0278685 | A1 | 11/2009 | Potyrailo et al. |
| 2010/0045360 | A1 | 2/2010 | Howard et al. |
| 2010/0153845 | A1 | 6/2010 | Gregorio et al. |
| 2010/0211902 | A1 | 8/2010 | Unsworth et al. |
| 2010/0231239 | A1 | 9/2010 | Tateishi et al. |
| 2010/0238121 | A1 | 9/2010 | Ely |
| 2010/0328249 | A1 | 12/2010 | Ningrat et al. |
| 2011/0005090 | A1 | 1/2011 | Lee et al. |
| 2011/0216311 | A1 | 9/2011 | Kachanov et al. |
| 2011/0267302 | A1 | 11/2011 | Fasshauer |
| 2011/0291821 | A1 | 12/2011 | Chung |
| 2011/0301876 | A1 | 12/2011 | Yamashita |
| 2013/0018489 | A1 | 1/2013 | Grunthaner et al. |
| 2013/0076374 | A1 | 3/2013 | Huang |
| 2013/0106756 | A1 | 5/2013 | Kono et al. |
| 2013/0106769 | A1 | 5/2013 | Bakken et al. |
| 2013/0269446 | A1 | 10/2013 | Fukushima et al. |
| 2014/0028327 | A1 | 1/2014 | Potyrailo et al. |
| 2014/0225599 | A1 | 8/2014 | Hess |
| 2014/0267065 | A1 | 9/2014 | Levesque |
| 2015/0022174 | A1 | 1/2015 | Nikitin |
| 2015/0077094 | A1 | 3/2015 | Baldwin et al. |
| 2015/0329199 | A1 | 11/2015 | Golbome et al. |
| 2016/0018940 | A1 | 1/2016 | Lo et al. |
| 2016/0048256 | A1 | 2/2016 | Day |
| 2016/0179243 | A1 | 6/2016 | Schwartz |
| 2016/0252403 | A1 | 9/2016 | Murakami |
| 2017/0077735 | A1 | 3/2017 | Leabman |
| 2017/0093222 | A1 | 3/2017 | Joye et al. |
| 2017/0147068 | A1 | 5/2017 | Yamazaki et al. |
| 2017/0168578 | A1 | 6/2017 | Tsukamoto et al. |
| 2017/0185173 | A1 | 6/2017 | Ito et al. |
| 2017/0187541 | A1 | 6/2017 | Sundaresan et al. |
| 2017/0328740 | A1 | 11/2017 | Widmer et al. |
| 2017/0371380 | A1 | 12/2017 | Oberhauser et al. |
| 2017/0371381 | A1 | 12/2017 | Liu |
| 2017/0371473 | A1 | 12/2017 | David et al. |
| 2018/0019722 | A1 | 1/2018 | Birkbeck |
| 2018/0055448 | A1 | 3/2018 | Karakaya et al. |
| 2018/0088064 | A1 | 3/2018 | Potyrailo et al. |
| 2018/0135409 | A1 | 5/2018 | Wilson et al. |
| 2018/0182212 | A1 | 6/2018 | Li et al. |
| 2018/0183372 | A1 | 6/2018 | Li et al. |
| 2018/0195881 | A1 | 7/2018 | Acker |
| 2018/0221796 | A1 | 8/2018 | Bonifas et al. |
| 2018/0229161 | A1 | 8/2018 | Maki et al. |
| 2018/0231485 | A1 | 8/2018 | Potyrailo et al. |
| 2018/0260049 | A1 | 9/2018 | D'Lionaird et al. |
| 2018/0260050 | A1* | 9/2018 | Unseld .................... G06F 3/044 |
| 2018/0321748 | A1 | 11/2018 | Rao et al. |
| 2019/0179146 | A1 | 6/2019 | De Nardi |
| 2019/0235629 | A1 | 8/2019 | Hu et al. |
| 2019/0302161 | A1 | 10/2019 | You et al. |
| 2019/0302193 | A1 | 10/2019 | Maru et al. |
| 2019/0302890 | A1 | 10/2019 | Marijanovic et al. |
| 2019/0302922 | A1* | 10/2019 | Das ........................ G06F 3/0416 |
| 2019/0302923 | A1* | 10/2019 | Maru .................... G06F 3/0416 |
| 2020/0064160 | A1* | 2/2020 | Maru ................. H03K 17/9537 |
| 2020/0117290 | A1* | 4/2020 | Kremin ................. G06F 3/0414 |
| 2020/0133455 | A1 | 4/2020 | Sepehr et al. |
| 2020/0177290 | A1 | 6/2020 | Reimer et al. |
| 2020/0191761 | A1 | 6/2020 | Potyrailo et al. |
| 2020/0271477 | A1 | 8/2020 | Kost et al. |
| 2020/0271706 | A1 | 8/2020 | Wardlaw et al. |
| 2020/0271745 | A1 | 8/2020 | Das et al. |
| 2020/0272301 | A1 | 8/2020 | Duewer et al. |
| 2020/0319237 | A1 | 10/2020 | Maru et al. |

FOREIGN PATENT DOCUMENTS

| | | | |
|---|---|---|---|
| DE | 102015215331 | A1 | 2/2017 |
| EP | 1697710 | B1 | 4/2007 |
| EP | 2682843 | A1 | 1/2014 |
| GB | 2573644 | A | 11/2019 |
| JP | 2006246289 | A | 9/2006 |
| WO | 00/33244 | A2 | 6/2000 |
| WO | 2007068283 | A1 | 6/2007 |
| WO | 2016032704 | A1 | 3/2016 |

OTHER PUBLICATIONS

International Search Report and Written Opinion of the International Searching Authority, International Application No. PCT/US2019/022578, dated May 27, 2019.

International Search Report and Written Opinion of the International Searching Authority, International Application No. PCT/US2019/021838, dated May 27, 2019.

International Search Report and Written Opinion of the International Searching Authority, International Application No. PCT/US2019/045554, dated Oct. 17, 2019.

Combined Search and Examination Report, UKIPO, Application No. GB1904250.6, dated Sep. 10, 2019.

Combined Search and Examination Report under Sections 17 and 18(3), UKIPO, Application No. GB2001341.3, dated Jun. 29, 2020.

* cited by examiner

RESONANT PHASE SENSING OF RESISTIVE-INDUCTIVE-CAPACITIVE SENSORS

RELATED APPLICATION

The present disclosure claims priority to U.S. Provisional Patent Application Ser. No. 62/739,970, filed Oct. 2, 2018, U.S. Provisional Patent Application Ser. No. 62/649,857, filed Mar. 29, 2018, and U.S. Provisional Patent Application Ser. No. 62/721,134, filed Aug. 22, 2018, all of which are incorporated by reference herein in their entireties.

FIELD OF DISCLOSURE

The present disclosure relates in general to electronic devices with user interfaces, (e.g., mobile devices, game controllers, instrument panels, etc.), and more particularly, resonant phase sensing of resistive-inductive-capacitive sensors for use in a system for mechanical button replacement in a mobile device, and/or other suitable applications.

BACKGROUND

Many traditional mobile devices (e.g., mobile phones, personal digital assistants, video game controllers, etc.) include mechanical buttons to allow for interaction between a user of a mobile device and the mobile device itself. However, such mechanical buttons are susceptible to aging, wear, and tear that may reduce the useful life of a mobile device and/or may require significant repair if malfunction occurs. Also, the presence of mechanical buttons may render it difficult to manufacture mobile devices to be waterproof. Accordingly, mobile device manufacturers are increasingly looking to equip mobile devices with virtual buttons that act as a human-machine interface allowing for interaction between a user of a mobile device and the mobile device itself. Similarly, mobile device manufacturers are increasingly looking to equip mobile devices with other virtual interface areas (e.g., a virtual slider, interface areas of a body of the mobile device other than a touch screen, etc.). Ideally, for best user experience, such virtual interface areas should look and feel to a user as if a mechanical button or other mechanical interface were present instead of a virtual button or virtual interface area.

Presently, linear resonant actuators (LRAs) and other vibrational actuators (e.g., rotational actuators, vibrating motors, etc.) are increasingly being used in mobile devices to generate vibrational feedback in response to user interaction with human-machine interfaces of such devices. Typically, a sensor (traditionally a force or pressure sensor) detects user interaction with the device (e.g., a finger press on a virtual button of the device) and in response thereto, the linear resonant actuator may vibrate to provide feedback to the user. For example, a linear resonant actuator may vibrate in response to user interaction with the human-machine interface to mimic to the user the feel of a mechanical button click.

However, there is a need in the industry for sensors to detect user interaction with a human-machine interface, wherein such sensors provide acceptable levels of sensor sensitivity, power consumption, and size.

SUMMARY

In accordance with the teachings of the present disclosure, the disadvantages and problems associated with sensing of human-machine interface interactions in a mobile device may be reduced or eliminated.

In accordance with embodiments of the present disclosure, a system may include a resistive-inductive-capacitive sensor, a driver configured to drive the resistive-inductive-capacitive sensor at a driving frequency, and a measurement circuit communicatively coupled to the resistive-inductive-capacitive sensor and configured to measure phase information associated with the resistive-inductive-capacitive sensor and based on the phase information, determine a displacement of a mechanical member relative to the resistive-inductive-capacitive sensor, wherein the displacement of the mechanical member causes a change in an impedance of the resistive-inductive-capacitive sensor.

In accordance with embodiments of the present disclosure, a method may include measuring phase information associated with a resistive-inductive-capacitive sensor driven by a driver at a driving frequency and based on the phase information, determining a displacement of a mechanical member relative to the resistive-inductive-capacitive sensor, wherein the displacement of the mechanical member causes a change in an impedance of the resistive-inductive-capacitive sensor.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

Figure 4A:
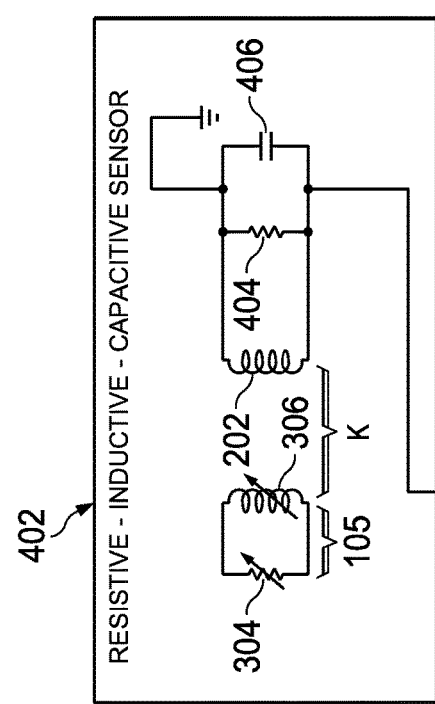
Figure 4B:
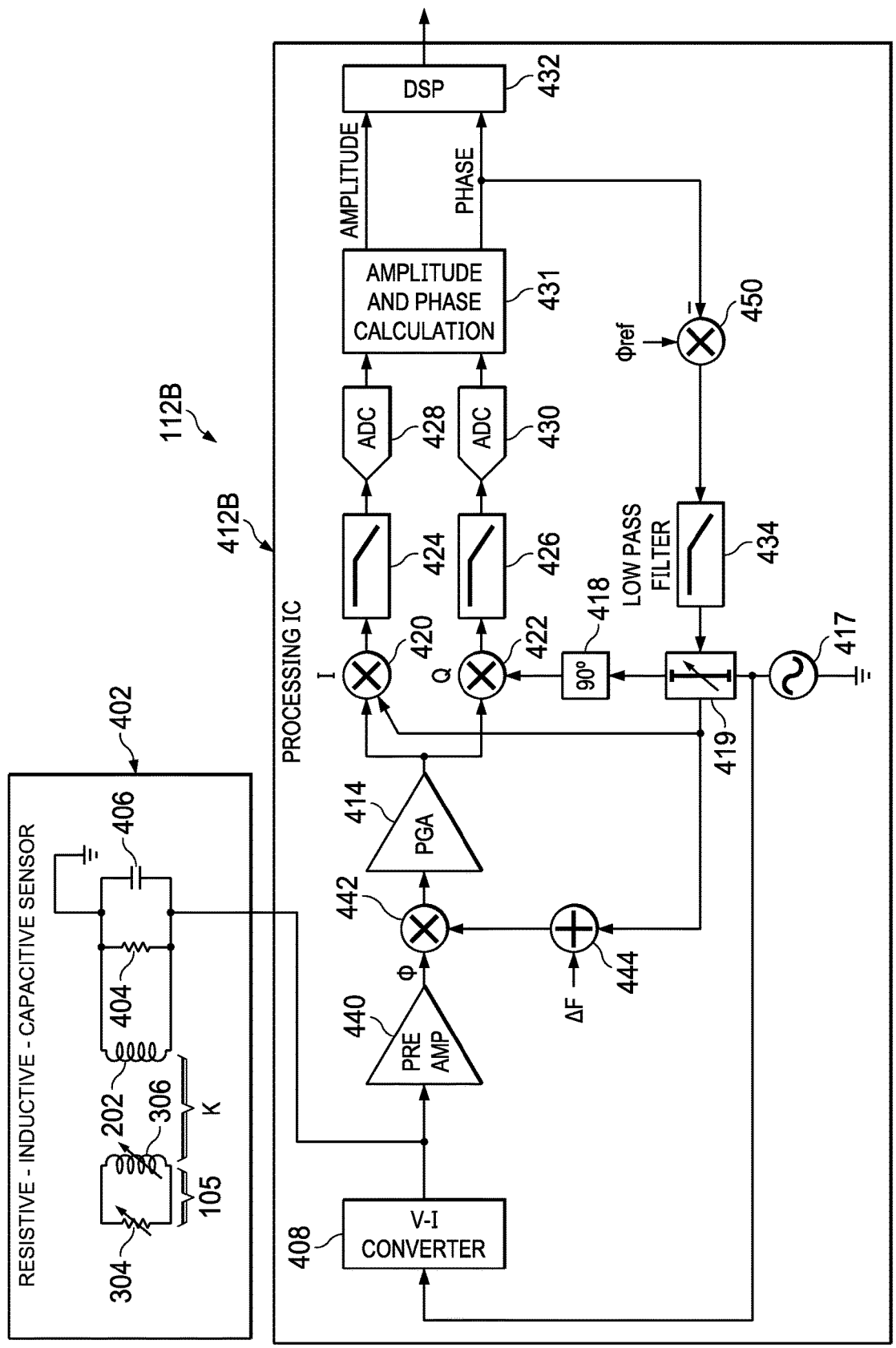
Figure 4C:
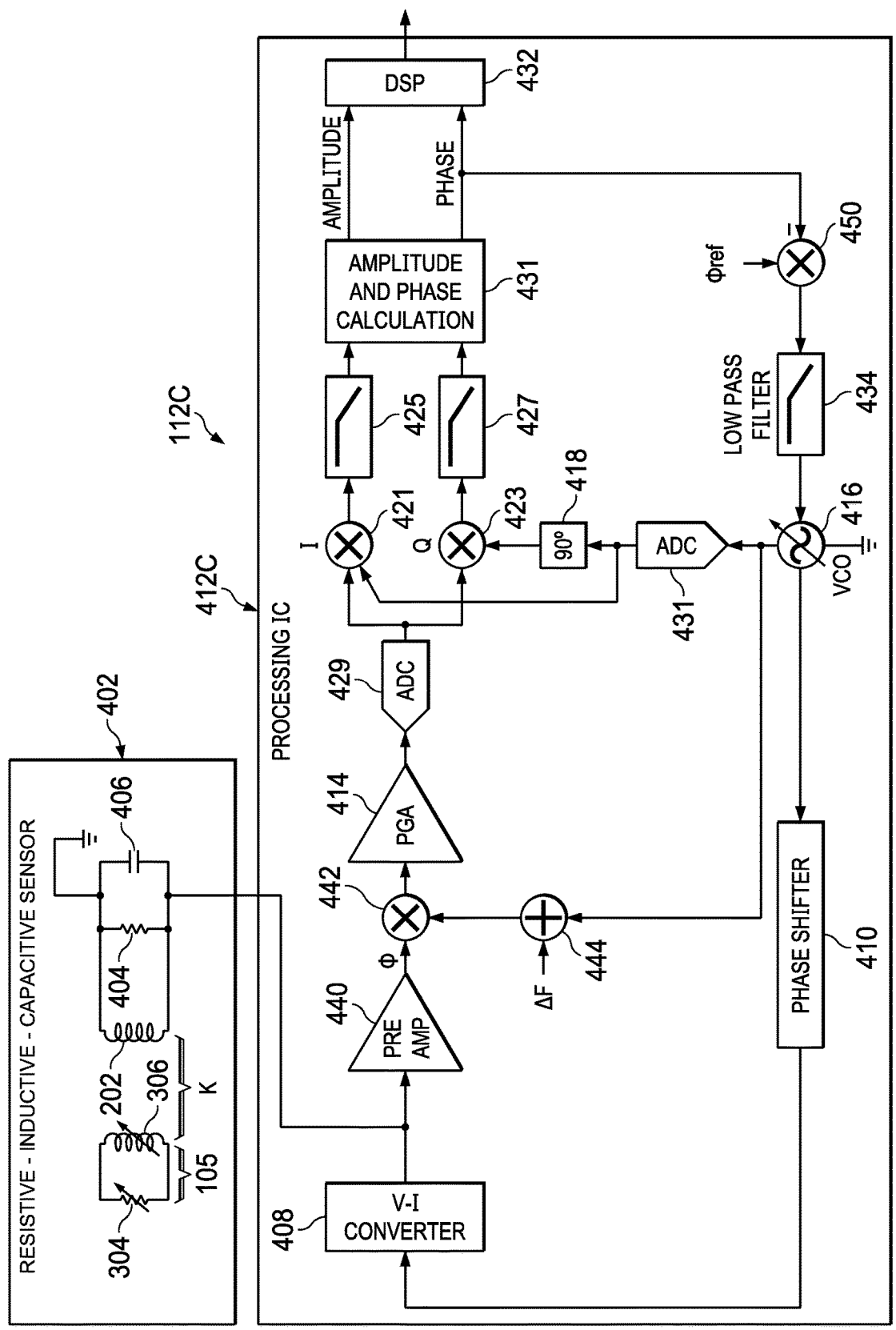
Figure 5:
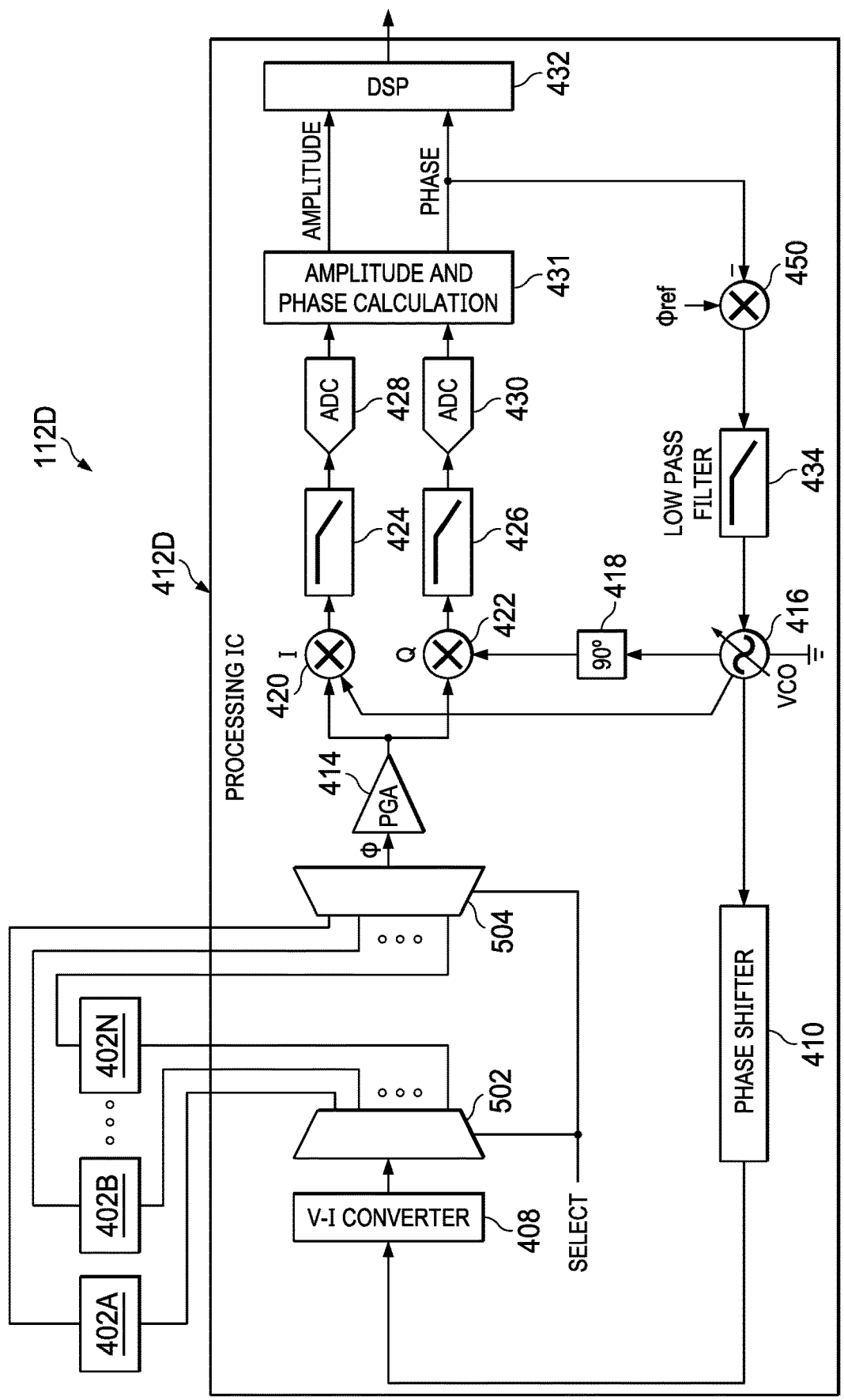
Figure 6:
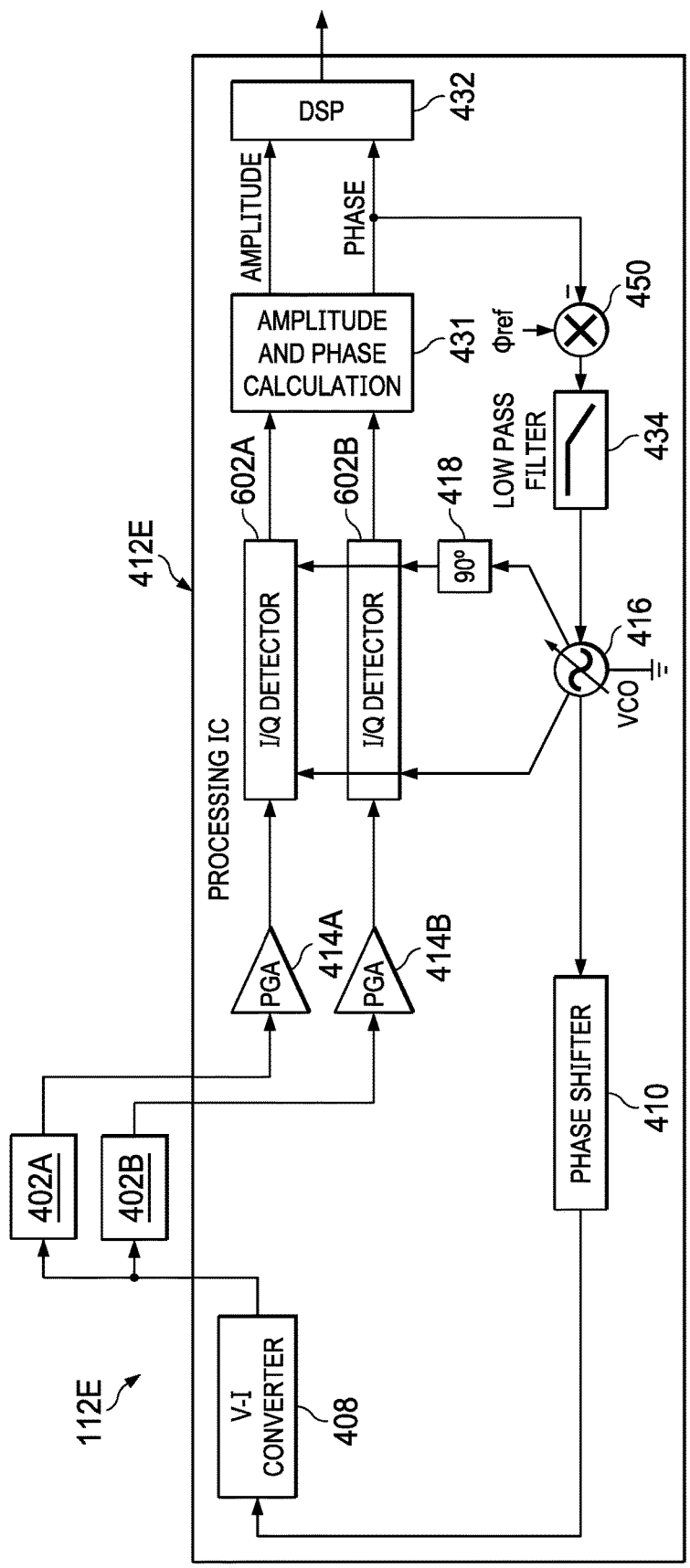
Figure 7:
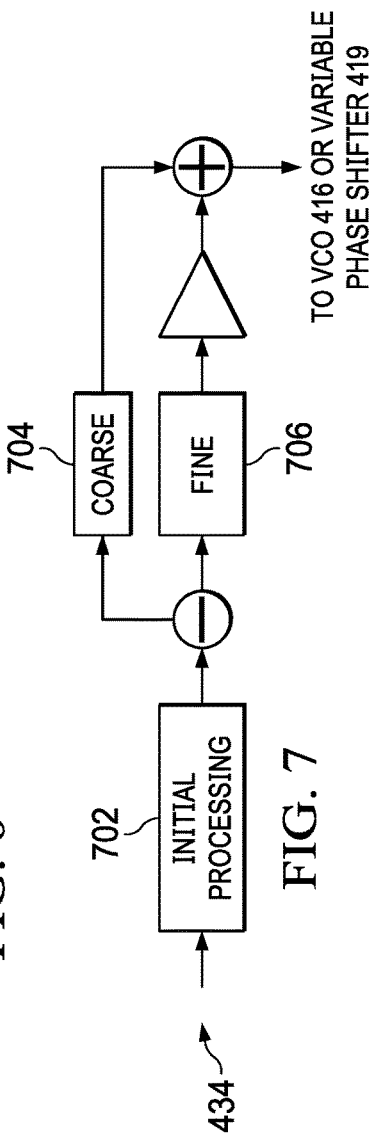

Each of FIGS. 4A-4C illustrates a diagram of selected components of an example resonant phase sensing system, in accordance with embodiments of the present disclosure;

FIG. 5 illustrates a diagram of selected components of an example resonant phase sensing system implementing time-division multiplexed processing of multiple resistive-inductive-capacitive sensors, in accordance with embodiments of the present disclosure;

FIG. 6 illustrates a diagram of selected components of an example resonant phase sensing system implementing simultaneous sensing of multiple resistive-inductive-capacitive sensors, in accordance with embodiments of the present disclosure; and FIG. 7 illustrates a diagram of selected functional components of an example low pass filter, in accordance with embodiments of the present disclosure.

DETAILED DESCRIPTION

Figure 1:
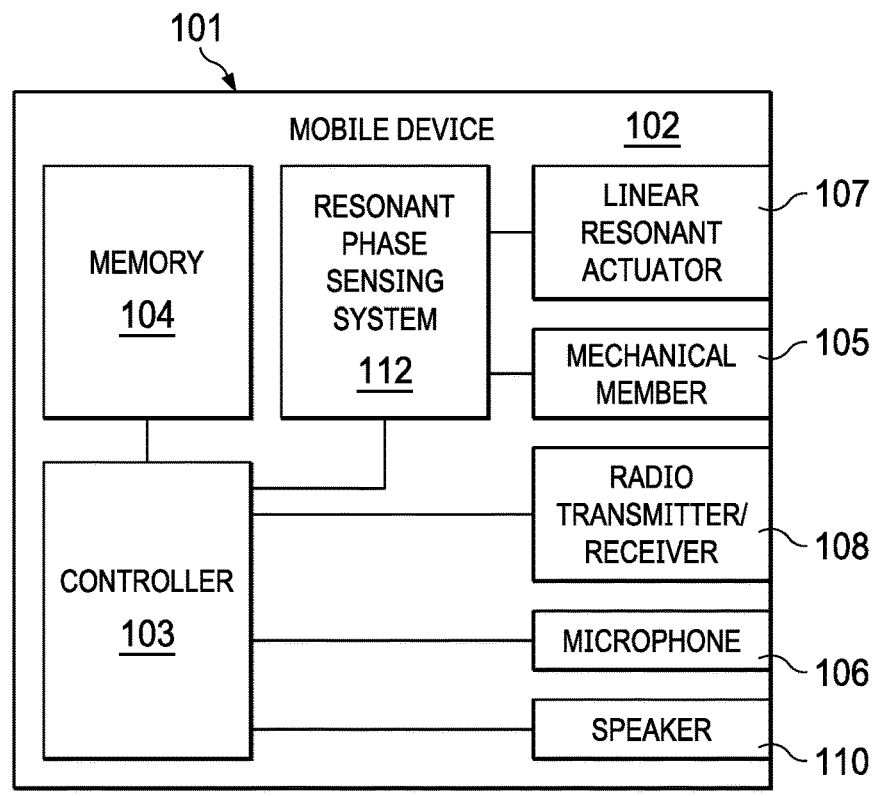
FIG. 1 illustrates a block diagram of selected components of an example mobile device, in accordance with embodiments of the present disclosure.

FIG. 1 illustrates a block diagram of selected components of an example mobile device 102, in accordance with embodiments of the present disclosure. As shown in FIG. 1, mobile device 102 may comprise an enclosure 101, a controller 103, a memory 104, a mechanical member 105, a microphone 106, a linear resonant actuator 107, a radio transmitter/receiver 108, a speaker 110, and a resonant phase sensing system 112.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, a video game controller, or any other device that may be readily transported on a person of a user of mobile device 102.

Controller 103 may be housed within enclosure 101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 103 may interpret and/or execute program instructions and/or process data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies based on sonic vibrations received at the diaphragm or membrane. Microphone 106 may include an electrostatic microphone, a condenser microphone, an electret microphone, a microelectromechanical systems (MEMs) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 110 may be housed at least partially within enclosure 101 or may be external to enclosure 101, may be communicatively coupled to controller 103, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The voice coil and the driver's magnetic system interact, generating a mechanical force that causes the voice coil (and thus, the attached cone) to move back and forth, thereby reproducing sound under the control of the applied electrical signal coming from the amplifier.

Mechanical member 105 may be housed within or upon enclosure 101, and may include any suitable system, device, or apparatus configured such that all or a portion of mechanical member 105 displaces in position responsive to a force, a pressure, or a touch applied upon or proximately to mechanical member 105. In some embodiments, mechanical member 105 may be designed to appear as a mechanical button on the exterior of enclosure 101.

Linear resonant actuator 107 may be housed within enclosure 101, and may include any suitable system, device, or apparatus for producing an oscillating mechanical force across a single axis. For example, in some embodiments, linear resonant actuator 107 may rely on an alternating current voltage to drive a voice coil pressed against a moving mass connected to a spring. When the voice coil is driven at the resonant frequency of the spring, linear resonant actuator 107 may vibrate with a perceptible force. Thus, linear resonant actuator 107 may be useful in haptic applications within a specific frequency range. While, for the purposes of clarity and exposition, this disclosure is described in relation to the use of linear resonant actuator 107, it is understood that any other type or types of vibrational actuators (e.g., eccentric rotating mass actuators) may be used in lieu of or in addition to linear resonant actuator 107. In addition, it is also understood that actuators arranged to produce an oscillating mechanical force across multiple axes may be used in lieu of or in addition to linear resonant actuator 107. As described elsewhere in this disclosure, a linear resonant actuator 107, based on a signal received from resonant phase sensing system 112, may render haptic feedback to a user of mobile device 102 for at least one of mechanical button replacement and capacitive sensor feedback.

Together, mechanical member 105 and linear resonant actuator 107 may form a human-interface device, such as a virtual interface (e.g., a virtual button), which, to a user of mobile device 102, has a look and feel of a mechanical button or other mechanical interface of mobile device 102.

Resonant phase sensing system 112 may be housed within enclosure 101, may be communicatively coupled to mechanical member 105 and linear resonant actuator 107, and may include any system, device, or apparatus configured to detect a displacement of mechanical member 105 indicative of a physical interaction (e.g., by a user of mobile device 102) with the human-machine interface of mobile device 102 (e.g., a force applied by a human finger to a virtual interface of mobile device 102). As described in greater detail below, resonant phase sensing system 112 may detect a displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105. Thus, mechanical member 105 may comprise any suitable system, device, or apparatus which all or a portion thereof may displace, and such displacement may cause a change in an impedance of a resistive-inductive-capacitive sensor integral to resonant phase sense system 112. Resonant phase sensing system 112 may also generate an electronic signal for driving linear resonant actuator 107 in response to a physical interaction associated with a human-machine interface associated with mechanical member 105. Detail of an example resonant phase sensing system 112 in accordance with embodiments of the present disclosure is depicted in greater detail below.

Although specific example components are depicted above in FIG. 1 as being integral to mobile device 102 (e.g., controller 103, memory 104, mechanical member 105, microphone 106, radio transmitter/receiver 108, speakers(s) 110, linear resonant actuator 107, etc.), a mobile device 102 in accordance with this disclosure may comprise one or more components not specifically enumerated above. For example, although FIG. 1 depicts certain user interface components, mobile device 102 may include one or more other user interface components in addition to those depicted in FIG. 1, including but not limited to a keypad, a touch screen, and a display, thus allowing a user to interact with and/or otherwise manipulate mobile device 102 and its associated components. In addition, although FIG. 1 depicts only a single virtual button comprising mechanical member 105 and linear resonant actuator 107 for purposes of clarity and exposition, in some embodiments a mobile device 102 may have multiple virtual interfaces each comprising a respective mechanical member 105 and linear resonant actuator 107.

Although, as stated above, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105, in some embodiments resonant phase sensing system 112 may primarily detect displacement of mechanical member 105 by using resonant phase sensing to determine a change in an inductance of a resistive-inductive-capacitive sensor. For example, FIGS. 2 and 3 illustrate selected components of an example inductive sensing application that may be implemented by resonant phase sensing system 112, in accordance with embodiments of the present disclosure.

Figure 2:
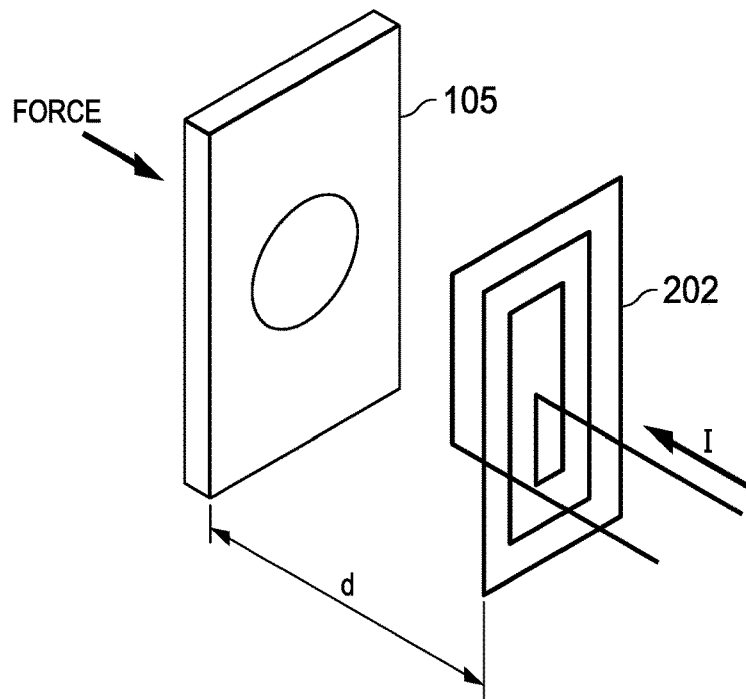
FIG. 2 illustrates a mechanical member separated by a distance from an inductive coil, in accordance with embodiments of the present disclosure.
Figure 3:
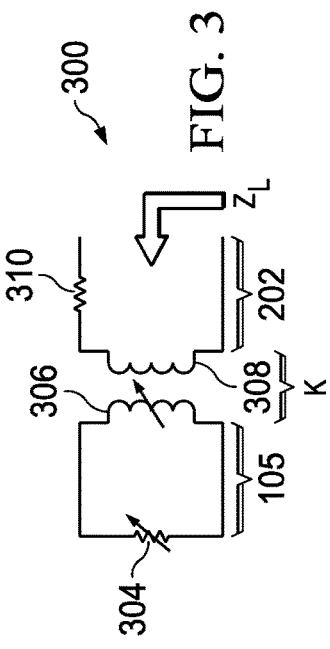
FIG. 3 illustrates selected components of an inductive sensing system that may be implemented by a resonant phase sensing system, in accordance with embodiments of the present disclosure.

FIG. 2 illustrates mechanical member 105 embodied as a metal plate separated by a distance d from an inductive coil 202, in accordance with embodiments of the present disclosure. FIG. 3 illustrates selected components of an inductive sensing system 300 that may be implemented by resonant phase sensing system 112, in accordance with embodiments of the present disclosure. As shown in FIG. 3, inductive sensing system 300 may include mechanical member 105, modeled as a variable electrical resistance 304 and a variable electrical inductance 306, and may include inductive coil 202 in physical proximity to mechanical member 105 such that inductive coil 202 has a mutual inductance with mechanical member 105 defined by a variable coupling coefficient k. As shown in FIG. 3, inductive coil 202 may be modeled as a variable electrical inductance 308 and a variable electrical resistance 310.

In operation, as a current I flows through inductive coil 202, such current may induce a magnetic field which in turn may induce an eddy current inside mechanical member 105. When a force is applied to and/or removed from mechanical member 105, which alters distance d between mechanical member 105 and inductive coil 202, the coupling coefficient k, variable electrical resistance 304, and/or variable electrical inductance 306 may also change in response to the change in distance. These changes in the various electrical parameters may, in turn, modify an effective impedance $Z_L$ of inductive coil 202.

FIG. 4A illustrates a diagram of selected components of an example resonant phase sensing system 112A, in accordance with embodiments of the present disclosure. In some embodiments, resonant phase sensing system 112A may be used to implement resonant phase sensing system 112 of FIG. 1. As shown FIG. 4A, resonant phase sensing system 112A may include a resistive-inductive-capacitive sensor 402 and a processing integrated circuit (IC) 412A.

As shown in FIG. 4A, resistive-inductive-capacitive sensor 402 may include mechanical member 105, inductive coil 202, a resistor 404, and capacitor 406, wherein mechanical member 105 and inductive coil 202 have a variable coupling coefficient k. Although shown in FIG. 4A to be arranged in parallel with one another, it is understood that inductive coil 202, resistor 404, and capacitor 406 may be arranged in any other suitable manner that allows resistive-inductive-capacitive sensor 402 to act as a resonant tank. For example, in some embodiments, inductive coil 202, resistor 404, and capacitor 406 may be arranged in series with one another. In some embodiments, resistor 404 may not be implemented with a stand-alone resistor, but may instead be implemented by a parasitic resistance of inductive coil 202, a parasitic resistance of capacitor 406, and/or any other suitable parasitic resistance.

Processing IC 412A may be communicatively coupled to resistive-inductive-capacitive sensor 402 and may comprise any suitable system, device, or apparatus configured to implement a measurement circuit to measure phase information associated with resistive-inductive-capacitive sensor 402 and based on the phase information, determine a displacement of mechanical member 105 relative to resistive-inductive-capacitive sensor 402. Thus, processing IC 412A may be configured to determine an occurrence of a physical interaction (e.g., press or release of a virtual button) associated with a human-machine interface associated with mechanical member 105 based on the phase information.

As shown in FIG. 4A, processing IC 412A may include a phase shifter 410, a voltage-to-current converter 408, a preamplifier 440, an intermediate frequency mixer 442, a combiner 444, a programmable gain amplifier (PGA) 414, a voltage-controlled oscillator (VCO) 416, a phase shifter 418, an amplitude and phase calculation block 431, a DSP 432, a low-pass filter 434, and a combiner 450. Processing IC 412A may also include a coherent incident/quadrature detector implemented with an incident channel comprising a mixer 420, a low-pass filter 424, and an analog-to-digital converter (ADC) 428, and a quadrature channel comprising a mixer 422, a low-pass filter 426, and an ADC 430 such that processing IC 412A is configured to measure the phase information using the coherent incident/quadrature detector.

Phase shifter 410 may include any system, device, or apparatus configured to detect an oscillation signal generated by processing IC 412A (as explained in greater detail below) and phase shift such oscillation signal (e.g., by 45 degrees) such that a normal operating frequency of resonant phase sensing system 112A, an incident component of a sensor signal $\phi$ generated by pre-amplifier 440 is approximately equal to a quadrature component of sensor signal $\phi$, so as to provide common mode noise rejection by a phase detector implemented by processing IC 412A, as described in greater detail below.

Voltage-to-current converter 408 may receive the phase shifted oscillation signal from phase shifter 410, which may be a voltage signal, convert the voltage signal to a corresponding current signal, and drive the current signal on resistive-inductive-capacitive sensor 402 at a driving frequency with the phase-shifted oscillation signal in order to generate sensor signal $\phi$ which may be processed by processing IC 412A, as described in greater detail below. In some embodiments, a driving frequency of the phase-shifted oscillation signal may be selected based on a resonant frequency of resistive-inductive-capacitive sensor 402 (e.g., may be approximately equal to the resonant frequency of resistive-inductive-capacitive sensor 402).

Preamplifier 440 may receive sensor signal $\phi$ and condition sensor signal $\phi$ for frequency mixing, with mixer 442, to an intermediate frequency $\Delta f$ combined by combiner 444 with an oscillation frequency generated by VCO 416, as described in greater detail below, wherein intermediate frequency $\Delta f$ is significantly less than the oscillation frequency. In some embodiments, preamplifier 440, mixer 442, and combiner 444 may not be present, in which case PGA 414 may receive sensor signal $\phi$ directly from resistive-inductive-capacitive sensor 402. However, when present, preamplifier 440, mixer 442, and combiner 444 may allow for mixing sensor signal $\phi$ down to a lower intermediate frequency $\Delta f$ which may allow for lower-bandwidth and more efficient ADCs (e.g., ADCs 428 and 430 of FIGS. 4A and 4B and ADC 429 of FIG. 4C, described below) and/or which may allow for minimization of phase and/or gain mismatches in the incident and quadrature paths of the phase detector of processing IC 412A.

In operation, PGA 414 may further amplify sensor signal $\phi$ to condition sensor signal $\phi$ for processing by the coherent incident/quadrature detector. VCO 416 may generate an oscillation signal to be used as a basis for the signal driven by voltage-to-current converter 408, as well as the oscillation signals used by mixers 420 and 422 to extract incident and quadrature components of amplified sensor signal $\phi$. As shown in FIG. 4A, mixer 420 of the incident channel may use an unshifted version of the oscillation signal generated by VCO 416, while mixer 422 of the quadrature channel may use a 90-degree shifted version of the oscillation signal phase shifted by phase shifter 418. As mentioned above, the oscillation frequency of the oscillation signal generated by VCO 416 may be selected based on a resonant frequency of resistive-inductive-capacitive sensor 402 (e.g., may be approximately equal to the resonant frequency of resistive-inductive-capacitive sensor 402).

In the incident channel, mixer 420 may extract the incident component of amplified sensor signal $\phi$, low-pass filter 424 may filter out the oscillation signal mixed with the amplified sensor signal $\phi$ to generate a direct current (DC) incident component, and ADC 428 may convert such DC incident component into an equivalent incident component digital signal for processing by amplitude and phase calculation block 431. Similarly, in the quadrature channel, mixer 422 may extract the quadrature component of amplified sensor signal $\phi$, low-pass filter 426 may filter out the phase-shifted oscillation signal mixed with the amplified sensor signal $\phi$ to generate a direct current (DC) quadrature component, and ADC 430 may convert such DC quadrature component into an equivalent quadrature component digital signal for processing by amplitude and phase calculation block 431.

Amplitude and phase calculation block 431 may include any system, device, or apparatus configured to receive phase information comprising the incident component digital signal and the quadrature component digital signal and based thereon, extract amplitude and phase information.

DSP 432 may include any system, device, or apparatus configured to interpret and/or execute program instructions and/or process data. In particular, DSP 432 may receive the phase information and the amplitude information generated by amplitude and phase calculation block 431 and based thereon, determine a displacement of mechanical member 105 relative to resistive-inductive-capacitive sensor 402, which may be indicative of an occurrence of a physical interaction (e.g., press or release of a virtual button or other interaction with a virtual interface) associated with a human-machine interface associated with mechanical member 105 based on the phase information. DSP 432 may also generate an output signal indicative of the displacement. In some embodiments, such output signal may comprise a control signal for controlling mechanical vibration of linear resonant actuator 107 in response to the displacement.

The phase information generated by amplitude and phase calculation block 431 may be subtracted from a reference phase $\phi_{ref}$ by combiner 450 in order to generate an error signal that may be received by low-pass filter 434. Low-pass filter 434 may low-pass filter the error signal, and such filtered error signal may be applied to VCO 416 to modify the frequency of the oscillation signal generated by VCO 416, in order to drive sensor signal $\phi$ towards reference phase $\phi_{ref}$. As a result, sensor signal $\phi$ may comprise a transient decaying signal in response to a "press" of a virtual button (or other interaction with a virtual interface) associated with resonant phase sensing system 112A as well as another transient decaying signal in response to a subsequent "release" of the virtual button (or other interaction with a virtual interface). Accordingly, low-pass filter 434 in connection with VCO 416 may implement a feedback control loop that may track changes in operating parameters of resonant phase sensing system 112A by modifying the driving frequency of VCO 416.

FIG. 4B illustrates a diagram of selected components of an example resonant phase sensing system 112B, in accordance with embodiments of the present disclosure. In some embodiments, resonant phase sensing system 112B may be used to implement resonant phase sensing system 112 of FIG. 1. Resonant phase sensing system 112B of FIG. 4B may be, in many respects, similar to resonant phase sensing system 112A of FIG. 4A. Accordingly, only those differences between resonant phase sensing system 112B and resonant phase sensing system 112A may be described below. As shown FIG. 4B, resonant phase sensing system 112B may include processing IC 412B in lieu of processing IC 412A. Processing IC 412B of FIG. 4B may be, in many respects, similar to processing IC 412A of FIG. 4A. Accordingly, only those differences between processing IC 412B and processing IC 412A may be described below.

Processing IC 412B may include fixed-frequency oscillator 417 and variable phase shifter 419 in lieu of VCO 416 of processing IC 412A. Thus, in operation, oscillator 417 may drive a fixed driving signal and oscillation signal which variable phase shifter 419 may phase shift to generate oscillation signals to be mixed by mixers 420 and 422. Similar to that of processing IC 412A, low-pass filter 434 may low-pass filter an error signal based on phase information extracted by amplitude and phase calculation block 431, but instead such filtered error signal may be applied to variable phase shifter 419 to modify the phase offset of the oscillation signal generated by oscillator 417, in order to drive sensor signal φ towards indicating a phase shift of zero. As a result, sensor signal φ may comprise a transient decaying signal in response to a "press" of a virtual button (or other interaction with a virtual interface) associated with resonant phase sensing system 112B as well as another transient decaying signal in response to a subsequent "release" of the virtual button (or other interaction with a virtual interface). Accordingly, low-pass filter 434 in connection with variable phase shifter 419 may implement a feedback control loop that may track changes in operating parameters of resonant phase sensing system 112B by modifying the phase shift applied by variable phase shifter 419.

FIG. 4C illustrates a diagram of selected components of an example resonant phase sensing system 112C, in accordance with embodiments of the present disclosure. In some embodiments, resonant phase sensing system 112C may be used to implement resonant phase sensing system 112 of FIG. 1. Resonant phase sensing system 112C of FIG. 4C may be, in many respects, similar to resonant phase sensing system 112A of FIG. 4A. Accordingly, only those differences between resonant phase sensing system 112C and resonant phase sensing system 112A may be described below. For example, a particular difference between resonant phase sensing system 112C and resonant phase sensing system 112A is that resonant phase sensing system 112C may include ADC 429 and ADC 431 in lieu of ADC 428 and ADC 430. Accordingly, a coherent incident/quadrature detector for resonant phase sensing system 112C may be implemented with an incident channel comprising a digital mixer 421 and a digital low-pass filter 425 (in lieu of analog mixer 420 and analog low-pass filter 424) and a quadrature channel comprising a digital mixer 423 and a low-pass filter 427 (in lieu of analog mixer 422 and analog low-pass filter 426) such that processing IC 412C is configured to measure the phase information using such coherent incident/quadrature detector. Although not explicitly shown, resonant phase sensing system 112B could be modified in a manner similar to that of how resonant phase sensing system 112A is shown to be modified to result in resonant phase sensing system 112C.

FIG. 5 illustrates a diagram of selected components of an example resonant phase sensing system 112D implementing time-division multiplexed processing of multiple resistive-inductive-capacitive sensors 402 (e.g., resistive-inductive-capacitive sensors 402A-402N shown in FIG. 5), in accordance with embodiments of the present disclosure. In some embodiments, resonant phase sensing system 112D may be used to implement resonant phase sensing system 112 of FIG. 1. Resonant phase sensing system 112D of FIG. 5 may be, in many respects, similar to resonant phase sensing system 112A of FIG. 4A. Accordingly, only those differences between resonant phase sensing system 112D and resonant phase sensing system 112A may be described below. In particular, resonant phase sensing system 112D may include a plurality of resistive-inductive-capacitive sensors 402 (e.g., resistive-inductive-capacitive sensors 402A-402N shown in FIG. 5) in lieu of the single resistive-inductive-capacitive sensor 402 shown in FIG. 4A. In addition, resonant phase sensing system 112D may include multiplexers 502 and 504, each of which may select an output signal from a plurality of input signals responsive to a control signal SELECT (which may be controlled by a time-division multiplexing control subsystem implemented by controller 103 or another suitable component of mobile device 102). Thus, while in some embodiments a device such as mobile device 102 may comprise a plurality of resistive-inductive-capacitive sensors 402 which may be simultaneously driven and separately processed by a respective processing IC, in other embodiments a resonant phase sensing system (e.g., resonant phase sensing system 112D) may drive resistive-inductive-capacitive sensors 402 in a time-division multiplexed manner. Such approach may reduce power consumption and device size as compared with multiple-sensor implementations in which the multiple sensors are simultaneously driven and/or sensed. Device size may be reduced by time-division multiplexing multiple sensors into a single driver and measurement circuit channel, wherein only a single driver and a single measurement circuit may be required, thus minimizing an amount of integrated circuit area needed to perform driving and measurement. In addition, by leveraging a single driver and measurement circuit, no calibration may be needed to adjust for mismatches and/or errors between different drivers and/or different measurement circuits.

For purposes of clarity and exposition, preamplifier 440, mixer 442, and combiner 444 have been excluded from FIG. 5. However, in some embodiments, processing IC 412D may include preamplifier 440, mixer 442, and combiner 444 similar to that depicted in FIGS. 4A-4C.

In resonant phase sensing system 112D, when a first resistive-inductive-capacitive sensor (e.g., resistive-inductive-capacitive sensor 402A) is selected by the time-division multiplexing control subsystem for being driven by voltage-to-current converter 408 and measured by the measurement circuit implemented by processing IC 412A, other resistive-inductive-capacitive sensors (e.g., resistive-inductive-capacitive sensors 402N-402N) may each be placed in a low-impedance state. Similarly, when a second resistive-inductive-capacitive sensor (e.g., resistive-inductive-capacitive sensor 402B) is selected by the time-division multiplexing control subsystem for being driven by voltage-to-current converter 408 and measured by the measurement circuit implemented by processing IC 412A, other resistive-inductive-capacitive sensors (e.g., resistive-inductive-capacitive sensors other than 402B, including 402A) may each be placed in a low-impedance state. Such an approach may minimize power consumption within unselected resistive-inductive-capacitive sensors 402.

A similar approach may also be used in a resonant phase sensing system having only a single resistive-inductive-capacitive sensor 402 in order to reduce power consumption associated with such sensor. For example, instead of time-division multiplexing among multiple sensors, a single resistive-inductive-capacitive sensor 402 may be duty-cycled in operation such that, for a first portion of a cycle of a measurement circuit (e.g., processing IC 412A), the measurement circuit may operate in a low power mode, and, for a second portion of the cycle of the measurement circuit, the measurement circuit may operate in a high power mode in which the measurement circuit consumes more power than in the low power mode, and wherein the measurement circuit performs measurement of the phase information and determination of the displacement of a mechanical member (e.g., mechanical member 105) during the second portion.

Although not explicitly shown, resonant phase sensing system 112B could be modified in a manner similar to that of how resonant phase sensing system 112A is shown to be modified to result in resonant phase sensing system 112D, such that resonant phase sensing system 112B could implement time-division multiplexed sensing on a plurality of resistive-inductive-capacitive sensors 402. Similarly, although not explicitly shown, resonant phase sensing system 112C could be modified in a manner similar to that of how resonant phase sensing system 112A is shown to be modified to result in resonant phase sensing system 112D, such that resonant phase sensing system 112C could implement time-division multiplexed sensing on a plurality of resistive-inductive-capacitive sensors 402.

FIG. 6 illustrates a diagram of selected components of an example resonant phase sensing system 112E implementing time-division multiplexed processing of multiple resistive-inductive-capacitive sensors 402 (e.g., resistive-inductive-capacitive sensors 402A and 402B shown in FIG. 6), in accordance with embodiments of the present disclosure. In some embodiments, resonant phase sensing system 112E may be used to implement resonant phase sensing system 112 of FIG. 1. Resonant phase sensing system 112E of FIG. 6 may be, in many respects, similar to resonant phase sensing system 112A of FIG. 4A. Accordingly, only those differences between resonant phase sensing system 112E and resonant phase sensing system 112A may be described below. In particular, resonant phase sensing system 112E may include a plurality of resistive-inductive-capacitive sensors 402 (e.g., resistive-inductive-capacitive sensors 402A and 402B shown in FIG. 6) in lieu of the single resistive-inductive-capacitive sensor 402 shown in FIG. 4A, wherein voltage-to-current converter 408 may drive both resistive-inductive-capacitive sensor 402 at the same driving frequency. In addition, processing IC 412E of resonant phase sensing system 112E may include a plurality of coherent incident/quadrature (I/Q) detectors 602 (e.g., 602a and 602b), each I/Q detector 602 associated with and coupled to a respective resistive-inductive-capacitive sensor 402, such that phase information associated with multiple sensors may be determined, from which human machine interactions with one or both sensors may be determined.

For purposes of clarity and exposition, preamplifier 440, mixer 442, and combiner 444 have been excluded from FIG. 6. However, in some embodiments, processing IC 412E may include preamplifier 440, mixer 442, and combiner 444 similar to that depicted in FIGS. 4A-4C.

FIG. 7 illustrates a diagram of selected functional components of an example low pass filter 434, in accordance with embodiments of the present disclosure. As shown in FIG. 7, low pass filter 434 may perform initial processing 702 on phase information it receives from amplitude and phase calculation block 431, and may implement a portion of a closed feedback loop with a fine adjustment block 706 to maintain stability of the closed feedback loop to track changes in phase and amplitude of sensor signal φ. In addition, low pass filter 434 may implement a coarse feedforward correction block 704 that allows the closed loop to be closed faster for the purpose of potentially shortening a needed sample time and power consumption of a phase detection event. Further, using the feedback and feedforward components shown in FIG. 7, a measurement circuit of a resonant phase sensing system 112 may measure amplitude information, in addition to the phase information, associated with a resistive-inductive-capacitive sensor, and based on the amplitude information and the phase information, determine the changes in operating parameters of the resistive-inductive-capacitive sensor, including parameters that may vary over time, temperature, and/or processes variations.

Although the foregoing contemplates use of closed-loop feedback for sensing of displacement, the various embodiments represented by FIGS. 4A-6 may be modified to implement an open-loop system for sensing of displacement. In such an open-loop system, a processing IC may include no feedback path from amplitude and phase calculation block 431 to VCO 416 or variable phase shifter 419 and thus may also lack a feedback low-pass filter 434. Thus, a phase measurement may still be made by comparing a change in phase to a reference phase value, but the oscillation frequency driven by VCO 416 may not be modified or the phase shifted by variable phase shifter 419 may not be shifted.

Although the foregoing contemplates use of a coherent incident/quadrature detector as a phase detector for determining phase information associated with resistive-inductive-capacitive sensor 402, a resonant phase sensing system 112 may perform phase detection and/or otherwise determine phase information associated with resistive-inductive-capacitive sensor 402 in any suitable manner, including, without limitation, using only one of the incident path or quadrature path to determine phase information.

In some embodiments, an incident/quadrature detector as disclosed herein may include one or more frequency translation stages that translate the sensor signal into direct-current signal directly or into an intermediate frequency signal and then into a direct-current signal. Any of such frequency translation stages may be implemented either digitally after an analog-to-digital converter stage or in analog before an analog-to-digital converter stage.

In addition, although the foregoing contemplates measuring changes in resistance and inductance in resistive-inductive-capacitive sensor 402 caused by displacement of mechanical member 105, other embodiments may operate based on a principle that any change in impedance based on displacement of mechanical member 105 may be used to sense displacement. For example, in some embodiments, displacement of mechanical member 105 may cause a change in a capacitance of resistive-inductive-capacitive sensor 402, such as if mechanical member 105 included a metal plate implementing one of the capacitive plates of capacitor 406.

Although DSP 432 may be capable of processing phase information to make a binary determination of whether physical interaction associated with a human-machine interface associated with mechanical member 105 has occurred and/or ceased to occur, in some embodiments, DSP 432 may quantify a duration of a displacement of mechanical member 105 to more than one detection threshold, for example to detect different types of physical interactions (e.g., a short press of a virtual button versus a long press of the virtual button). In these and other embodiments, DSP 432 may quantify a magnitude of the displacement to more than one detection threshold, for example to detect different types of physical interactions (e.g., a light press of a virtual button versus a quick and hard press of the virtual button).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
  a resistive-inductive-capacitive sensor;
  a driver configured to drive the resistive-inductive-capacitive sensor with a driving signal at a driving frequency;
  a measurement circuit communicatively coupled to the resistive-inductive-capacitive sensor and configured to:
    measure phase information associated with the resistive-inductive-capacitive sensor, wherein the phase information is relative to a phase of the driving signal; and
    based on the phase information, determine a displacement of a mechanical member relative to the resistive-inductive-capacitive sensor, wherein the displacement of the mechanical member causes a change in an impedance of the resistive-inductive-capacitive sensor.

2. The system of claim 1, wherein the measurement circuit is further configured to determine an occurrence of a physical interaction associated with a human-machine interface associated with the mechanical member based on the phase information.

3. The system of claim 2, wherein the physical interaction comprises one of pressing of a virtual interface by a user of the system and releasing of a virtual interface by a user of the system.

4. The system of claim 1, wherein the measurement circuit comprises a coherent incident/quadrature detector and the measurement circuit is configured to measure the phase information using the coherent incident/quadrature detector.

5. The system of claim 4, wherein the driving frequency is selected based on a resonant frequency of the resistive-inductive-capacitive sensor.

6. The system of claim 4, further comprising a control loop to track changes in operating parameters of the system by modifying one or more of the driving frequency and a phase shift associated with the phase information.

7. The system of claim 6, wherein the control loop comprises at least one of a feedforward control loop component and a feedback control loop component.

8. The system of claim 7, wherein the measurement circuit is further configured to:
  measure amplitude information associated with the resistive-inductive-capacitive sensor; and
  based on the amplitude information and the phase information, determine the changes in the operating parameters.

9. The system of claim 4, further comprising:
  a first analog-to-digital converter coupled to an output of an incident channel of the coherent incident/quadrature detector; and
  a second analog-to-digital converter coupled to an output of a quadrature channel of the coherent incident/quadrature detector;
  such that the coherent incident/quadrature detector operates in an analog signal domain.

10. The system of claim 4, further comprising:
  a first analog-to-digital converter interfaced between the resistive-inductive-capacitive sensor and an incident channel of the coherent incident/quadrature detector; and
  a second analog-to-digital converter interfaced between the resistive-inductive-capacitive sensor and a quadrature channel of the coherent incident/quadrature detector;
  such that the coherent incident/quadrature detector operates in a digital signal domain.

11. The system of claim 1, wherein:
the resistive-inductive-capacitive sensor comprises a resistive element, a capacitive element, and an inductive element; and
one element of the resistive element, the capacitive element, and the inductive element is in series with at least one other element of the resistive element, the capacitive element, and the inductive element.

12. The system of claim 1, wherein:
the resistive-inductive-capacitive sensor comprises a resistive element, a capacitive element, and an inductive element; and
one element of the resistive element, the capacitive element, and the inductive element is in parallel with at least one other element of the resistive element, the capacitive element, and the inductive element.

13. The system of claim 1, further comprising a second resistive-inductive-capacitive sensor, wherein the driver is configured to simultaneously drive the resistive-inductive-capacitive sensor and the second resistive-inductive-capacitive sensor at the driving frequency.

14. The system of claim 1, further comprising:
a second resistive-inductive-capacitive sensor; and
a time-division multiplexing control subsystem configured to:
time-division multiplex drive the resistive-inductive-capacitive sensor and the second resistive-inductive-capacitive sensor by the driver; and
time-division multiplex measure by the measurement circuit the phase information associated with the resistive-inductive-capacitive sensor and measure the phase information associated with the second resistive-inductive-capacitive sensor.

15. The system of claim 14, wherein:
when the resistive-inductive-capacitive sensor is selected by the time-division multiplexing control subsystem for being driven by the driver and measured by the measurement circuit, the second resistive-inductive-capacitive sensor is placed in a low-impedance state; and
when the second resistive-inductive-capacitive sensor is selected by the time-division multiplexing control subsystem for being driven by the driver and measured by the measurement circuit, the resistive-inductive-capacitive sensor is placed in the low-impedance state.

16. The system of claim 1, wherein the measurement circuit is further configured to quantify a duration of the displacement to more than one detection threshold.

17. The system of claim 1, wherein the measurement circuit is further configured to quantify a magnitude of the displacement to more than one detection threshold.

18. The system of claim 1, wherein the measurement circuit is configured to be duty-cycled in operation such that:
for a first portion of a cycle of the measurement circuit, the measurement circuit is in a low power mode; and
for a second portion of the cycle of the measurement circuit, the measurement circuit is in a high power mode in which the measurement circuit consumes more power than in the low power mode, and wherein the measurement performs measurement of the phase information and determination of the displacement during the second portion.

19. The system of claim 1, wherein the mechanical member comprises a metal plate.

20. A method comprising:
measuring phase information associated with a resistive-inductive-capacitive sensor driven with a driving signal by a driver at a driving frequency, wherein the phase information is relative to a phase of the driving signal; and
based on the phase information, determining a displacement of a mechanical member relative to the resistive-inductive-capacitive sensor, wherein the displacement of the mechanical member causes a change in an impedance of the resistive-inductive-capacitive sensor.

21. The method of claim 20, wherein the measurement circuit is further configured to determine an occurrence of a physical interaction associated with a human-machine interface associated with the mechanical member based on the phase information.

22. The method of claim 21, wherein the physical interaction comprises one of pressing of a virtual interface by a user of the system and releasing of a virtual interface by a user of the system.

23. The method of claim 20, wherein the measurement circuit comprises a coherent incident/quadrature detector and the measurement circuit is configured to measure the phase information using the coherent incident/quadrature detector.

24. The method of claim 23, wherein the driving frequency is selected based on a resonant frequency of the resistive-inductive-capacitive sensor.

25. The method of claim 23, further comprising a control loop to track changes in operating parameters of the system by modifying one or more of the driving frequency and a phase shift associated with the phase information.

26. The method of claim 25, wherein the control loop comprises at least one of a feedforward control loop component and a feedback control loop component.

27. The method of claim 26, wherein the measurement circuit is further configured to:
measure amplitude information associated with the resistive-inductive-capacitive sensor; and
based on the amplitude information and the phase information, determine the changes in the operating parameters.

28. The method of claim 23, further comprising:
a first analog-to-digital converter coupled to an output of an incident channel of the coherent incident/quadrature detector; and
a second analog-to-digital converter coupled to an output of a quadrature channel of the coherent incident/quadrature detector;
such that the coherent incident/quadrature detector operates in an analog signal domain.

29. The method of claim 23, further comprising:
a first analog-to-digital converter interfaced between the resistive-inductive-capacitive sensor and an incident channel of the coherent incident/quadrature detector; and
a second analog-to-digital converter interfaced between the resistive-inductive-capacitive sensor and a quadrature channel of the coherent incident/quadrature detector;
such that the coherent incident/quadrature detector operates in a digital signal domain.

30. The method of claim 20, wherein:
the resistive-inductive-capacitive sensor comprises a resistive element, a capacitive element, and an inductive element; and
one element of the resistive element, the capacitive element, and the inductive element is in series with at least one other element of the resistive element, the capacitive element, and the inductive element.

31. The method of claim 20, wherein:
the resistive-inductive-capacitive sensor comprises a resistive element, a capacitive element, and an inductive element; and
one element of the resistive element, the capacitive element, and the inductive element is in parallel with at least one other element of the resistive element, the capacitive element, and the inductive element.

32. The method of claim 20, further comprising a second resistive-inductive-capacitive sensor, wherein the driver is configured to simultaneously drive the resistive-inductive-capacitive sensor and the second resistive-inductive-capacitive sensor at the driving frequency.

33. The method of claim 20, further comprising:
a second resistive-inductive-capacitive sensor; and
a time-division multiplexing control subsystem configured to:
time-division multiplex drive the resistive-inductive-capacitive sensor and the second resistive-inductive-capacitive sensor by the driver; and
time-division multiplex measure by the measurement circuit the phase information associated with the resistive-inductive-capacitive sensor and measure the phase information associated with the second resistive-inductive-capacitive sensor.

34. The method of claim 33, wherein:
when the resistive-inductive-capacitive sensor is selected by the time-division multiplexing control subsystem for being driven by the driver and measured by the measurement circuit, the second resistive-inductive-capacitive sensor is placed in a low-impedance state; and
when the second resistive-inductive-capacitive sensor is selected by the time-division multiplexing control subsystem for being driven by the driver and measured by the measurement circuit, the resistive-inductive-capacitive sensor is placed in the low-impedance state.

35. The method of claim 20, wherein the measurement circuit is further configured to quantify a duration of the displacement to more than one detection threshold.

36. The method of claim 20, wherein the measurement circuit is further configured to quantify a magnitude of the displacement to more than one detection threshold.

37. The method of claim 20, wherein the measurement circuit is configured to be duty-cycled in operation such that:
for a first portion of a cycle of the measurement circuit, the measurement circuit is in a low power mode; and
for a second portion of the cycle of the measurement circuit, the measurement circuit is in a high power mode in which the measurement circuit consumes more power than in the low power mode, and wherein the measurement performs measurement of the phase information and determination of the displacement during the second portion.

38. The method of claim 20, wherein the mechanical member comprises a metal plate.

* * * * *